United States Patent
Yang et al.

(10) Patent No.: US 10,332,914 B2
(45) Date of Patent: Jun. 25, 2019

(54) METHOD OF MANUFACTURING ELECTRONIC DEVICE AND ELECTRONIC DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Jiantao Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/741,853

(22) Filed: Jun. 17, 2015

(65) Prior Publication Data
US 2016/0233170 A1    Aug. 11, 2016

(30) Foreign Application Priority Data
Feb. 10, 2015   (CN) .......................... 2015 1 0069890

(51) Int. Cl.
*H01L 21/02*   (2006.01)
*H01L 27/12*   (2006.01)
(Continued)

(52) U.S. Cl.
CPC ...... *H01L 27/124* (2013.01); *H01L 21/02068* (2013.01); *H01L 31/022466* (2013.01);
(Continued)

(58) Field of Classification Search
CPC ......... H01L 23/53276; H01L 21/02068; H01L 31/022466; H01L 27/142; H01L 27/124;
(Continued)

(56) References Cited

U.S. PATENT DOCUMENTS

2003/0039604 A1   2/2003   Niu et al.
2004/0009346 A1   1/2004   Jang et al.
(Continued)

FOREIGN PATENT DOCUMENTS

CN           1742056 A     3/2006
CN          101021658 A    8/2007
(Continued)

OTHER PUBLICATIONS

Baoming Li, et al; "Study on Secondary Doping Modification of Poly(3,4-ethylene dioxythiophene)", Semiconductor Optoelectronics, vol. 31, No. 6, Dec. 2010; 4 pages.
(Continued)

*Primary Examiner* — Jasmine J Clark
(74) *Attorney, Agent, or Firm* — Ladas & Parry LLP

(57) ABSTRACT

A method of manufacturing an electronic device and an electronic device are disclosed. The manufacturing method including: forming a carbon nanotube electrode pattern on a substrate; placing the substrate on which the electron pattern is formed in a first oxidizing solution, to first dope the carbon nanotubes forming the electrode pattern; and spraying the electrode using a second oxidizing solution to second dope the carbon nanotubes forming the electrode pattern.

15 Claims, 3 Drawing Sheets

(51) Int. Cl.
  *H01L 31/18* (2006.01)
  *H01L 51/00* (2006.01)
  *H01L 51/10* (2006.01)
  *H01L 51/44* (2006.01)
  *G02F 1/1343* (2006.01)
  *H01L 31/0224* (2006.01)
  *H01L 29/40* (2006.01)

(52) U.S. Cl.
  CPC ...... *H01L 31/1884* (2013.01); *H01L 51/0021* (2013.01); *H01L 51/105* (2013.01); *H01L 51/444* (2013.01); *G02F 1/13439* (2013.01); *Y02E 10/549* (2013.01); *Y02P 70/521* (2015.11)

(58) Field of Classification Search
  CPC ............... H01L 29/0669; H01L 29/413; H01L 21/0223; H01L 21/02115; H01L 51/002; H01L 51/0048; H01L 51/444; H01L 27/3244; H01L 21/00; H01L 29/0665; H01L 29/0673; H01J 2201/30469; H05K 1/09
  See application file for complete search history.

(56) References Cited

U.S. PATENT DOCUMENTS

| | | | |
|---|---|---|---|
| 2004/0220066 A1* | 11/2004 | Rutter, Jr. | C11D 7/14 510/175 |
| 2005/0224765 A1 | 10/2005 | Hsu et al. | |
| 2006/0057290 A1 | 3/2006 | Glatkowski | |
| 2006/0113510 A1 | 6/2006 | Luo et al. | |
| 2007/0161501 A1 | 7/2007 | Chien et al. | |
| 2008/0088219 A1* | 4/2008 | Yoon | B82Y 10/00 313/326 |
| 2008/0296683 A1 | 12/2008 | Yoon et al. | |
| 2009/0211901 A1 | 8/2009 | Kajiura et al. | |
| 2009/0278116 A1 | 11/2009 | Yamate | |
| 2010/0051471 A1 | 3/2010 | Meng et al. | |
| 2010/0108956 A1 | 5/2010 | Miyazawa et al. | |
| 2011/0086176 A1* | 4/2011 | Yoon | B82Y 10/00 427/443.2 |
| 2011/0240929 A1 | 10/2011 | Yang et al. | |
| 2012/0141666 A1 | 6/2012 | Yoon et al. | |
| 2012/0156389 A1 | 6/2012 | Kotov | |
| 2012/0295071 A1 | 11/2012 | Sato et al. | |
| 2012/0327024 A1 | 12/2012 | Veerasamy | |
| 2013/0183439 A1 | 7/2013 | Starkovich et al. | |
| 2013/0187097 A1 | 7/2013 | Hong et al. | |
| 2014/0212672 A1* | 7/2014 | Han | H01B 1/22 428/408 |
| 2016/0137533 A1* | 5/2016 | Na | C02F 1/46109 205/759 |

FOREIGN PATENT DOCUMENTS

| | | |
|---|---|---|
| CN | 101053788 A | 10/2007 |
| CN | 101165883 A | 4/2008 |
| CN | 101253610 A | 8/2008 |
| CN | 101314470 A | 12/2008 |
| CN | 101508432 A | 8/2009 |
| CN | 101545886 A | 9/2009 |
| CN | 101760806 A | 6/2010 |
| CN | 101838641 A | 9/2010 |
| CN | 102129336 A | 7/2011 |
| CN | 102201548 A | 9/2011 |
| CN | 102460766 A | 5/2012 |
| CN | 102781816 A | 11/2012 |
| CN | 103000816 A | 3/2013 |
| CN | 103140439 A | 6/2013 |
| CN | 103345963 A | 10/2013 |
| CN | 103450681 A | 12/2013 |
| CN | 103531304 * | 1/2014 |
| CN | 103531304 A | 1/2014 |
| CN | 103928637 A | 7/2014 |
| CN | 103971954 A | 8/2014 |
| CN | 104059432 A | 9/2014 |
| CN | 104332390 A | 2/2015 |
| CN | 104576321 A | 4/2015 |
| EP | 2528855 A1 | 12/2012 |
| KR | 1020130135416 A | 12/2013 |
| WO | 2008/057615 A2 | 5/2008 |

OTHER PUBLICATIONS

First Chinese Office Action dated Apr. 5, 2016; Appln. No. 201510069890.6.
Second Chinese Office Action dated Nov. 7, 2016; Appln. No. 201510069890.6.
ISR & WO dated Nov. 2, 2015; PCT/CN2015/082063.
First Chinese Office Action dated Aug. 25, 2016; Appln, No. 201510247050.4.
Second Chinese Office Action dated Jan. 17, 2017; Appln. No. 201510247050.4.
First Chinese Office Action dated Nov. 30, 2016; Appln. No. 201510051430.0.
First Chinese Office Action dated Apr. 1, 2017; Appln. No. 201510155885.7.
USPTO NFOA dated Apr. 6, 2017 in connection with U.S Appl. No. 15/142,781.
The Second Chinese Office Action dated Jun. 5, 2017; Appln. No. 201510051430.0
USPTO FOA dated Aug. 16, 2017 in connection with U.S. Appl. No. 15/142,781.
USPTO FOA dated Feb. 22, 2018 in connection with U.S. Appl. No. 15/142,78.
Taisi Takenobu, et al; "Stable and controlled amphoteric doping by encapsulation of organic molecules inside carbon nanotubes", Nature Materials, vol. 2, Oct. 2003, 6 pages.
The Second Chinese Office Action dated Nov. 3, 2017, Appln. No. 201510155885.7.
The Third Chinese Office Action dated Apr. 17, 2018; Appln. No. 201510155885.7.
USPTO NFOA dated Jan. 2, 2018 in connection with U.S. Appl. No. 15/072,564.
USPTO NFOA dated Jun. 14, 2018 in connection with U.S. Appl. No. 14/912,622.
USPTO NFOA dated Jul. 23, 2018 in connection with U.S. Appl. No. 15/142,781.

* cited by examiner

METHOD OF MANUFACTURING ELECTRONIC DEVICE AND ELECTRONIC DEVICE

TECHNICAL FIELD

The embodiments of the present disclosure relate to a method of manufacturing an electronic device and an electronic device, to improve the conductivity of the electrode formed using carbon nanotubes in the electronic device.

BACKGROUND

Transparent electrodes are required to be used in a great deal of electronic equipments, such as pixel electrodes in a display device, electrodes of a solar cell used in a display device, and the like.

Indium tin oxide (ITO) is a material used extensively for the production of a transparent electrode. However, due to the insufficient flexibility of indium tin oxide, the electrode manufactured using indium tin oxide is liable to break upon folding the equipment, thereby affecting the performance of a product.

Carbon nanotubes are one-dimensional quantum materials. Carbon nanotubes have several layers to dozens of layers of coaxial circular tubes consisting primarily of carbon atoms in hexagonal arrangement.

Carbon nanotubes can achieve the conductive function because their structures are the same as the lamellar structures of graphite. At the same time, however, carbon nanotubes also exhibit excellent mechanical properties, as well as outstanding strength, elasticity, fatigue resistance, and isotropic properties. Therefore, more and more transparent electrodes are being made of carbon nanotubes.

Needless to say, the above defect would also appear when carbon nanotubes are used for forming electrodes of electronic devices of other non-transparent applications (e.g., electrodes of thin film transistors in a display panel), and no more exemplification is made herein.

SUMMARY

An embodiment of the present disclosure provides a method of manufacturing an electronic device, comprising: forming a carbon nanotube electrode pattern on a substrate; a soaking step: placing the substrate on which the electron pattern is formed into a first oxidizing solution, to first dope the carbon nanotubes forming the electrode pattern; a spraying step: spraying the electrode using a second oxidizing solution, to second dope the carbon nanotubes forming the electrode pattern.

In some embodiments of the present disclosure, the above-mentioned method of manufacturing an electronic device further comprises: washing the sprayed substrate.

In some embodiments of the present disclosure, in the above-mentioned method of manufacturing an electronic device, in the washing step, deionized water is used for washing.

In some embodiments of the present disclosure, the above-mentioned method of manufacturing an electronic device further comprises: drying the washed substrate.

In some embodiments of the present disclosure, in the above-mentioned method of manufacturing an electronic device, the first solution and the second solution are selected from a solution formed from at least one of the following materials: nitrogen dioxide, elemental bromine, nitric acid, thionyl chloride, perfluorosulfonic acid-PTFE copolymer and 2,3,5,6-tetrafluoro-7,7',8,8'-tetracyano dimethyl-p-benzoquinone.

In some embodiments of the present disclosure, the above-mentioned method of manufacturing an electronic device further comprises: forming a conductive protective pattern on the electrode pattern.

In some embodiments of the present disclosure, in the above-mentioned method of manufacturing an electronic device, the conductive protective pattern is formed from a conductive polymer material.

In some embodiments of the present disclosure, in the above-mentioned method of manufacturing an electronic device, the conductive protective pattern is formed from a conductive polymer material doped with nano golden balls or nano silver wires.

In some embodiments of the present disclosure, in the above-mentioned method of manufacturing an electronic device, the conductive polymer material is selected from the group consisting of: polyacetylene, polythiophene, polypyrrole, polyaniline, polyphenylene, polyphenylene acetylene and poly diacetylene.

In some embodiments of the present disclosure, in the above-mentioned method of manufacturing an electronic device, forming a conductive protective pattern on the electrode pattern comprises: subjecting the conductive polymer material to a solvation treatment using a room-temperature ionic liquid; forming the conductive protective pattern using the conductive polymer material after the solvation treatment.

In some embodiments of the present disclosure, in the above-mentioned method of manufacturing an electronic device, the room-temperature ionic liquid is selected from the group consisting of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethylsulfonate, 1-butyl-3-methylimidazolium chloride salt.

In some embodiments of the present disclosure, in the above-mentioned method of manufacturing an electronic device, the electrode pattern is an electrode of a solar cell.

In some embodiments of the present disclosure, in the above-mentioned method of manufacturing an electronic device, the electronic device is a display panel provided with a solar cell, the electrode pattern being an electrode of the solar cell.

The embodiments of the present disclosure further provide an electronic device obtained using the manufacturing method described above.

The present disclosure further designs a protective layer structure on the doped electrode structure.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

To make the objects, technical solutions and advantages of the examples of the present disclosure clearer, the technical solutions of the examples of the present disclosure will be described in more clearly and completely manner below in conjunction with the accompanying drawings of the examples of the present disclosure. Apparently, the technical, solutions described are merely part rather than all of the examples of the present disclosure. Based on the examples of the present disclosure described, all the other examples obtained by one of ordinary skill in the art without paying any creative work are within the scope of the present disclosure.

In the method of manufacturing an electronic device and the electronic device of the embodiments of the present disclosure, the electrode formed by carbon nanotubes is P-doped using two doping treatments, i.e., soak-doping and spray-doping, which takes into account the stability and efficiency of the doping process while improving the conductivity of the electrode formed by carbon nanotubes.

Prior to describing in detail the method of manufacturing an electronic device and the electronic device of the embodiments of the present disclosure, several terms involved in the embodiments of the present disclosure will be briefly described at first, to facilitate better understanding of the embodiments of the present disclosure.

P-doping of the electrode formed by carbon nanotubes can be carried out by two modes, namely: a soaking mode and a spraying mode.

The so-called soaking mode refers to the process of soaking the entire pattern formed by carbon nanotubes into a P-doped solution, which can rapidly achieve doping of the pattern formed by carbon nanotubes. However, in the production process, as the doping process continues, the solution concentration will change, which will lead to inconsistency in the doping degrees of the pattern formed by carbon nanotubes within a unit time period.

Because it is hardly feasible to maintain the consistency of the solution concentration at different stages of the production process, it is difficult to control the precision of doping upon doping the pattern formed by carbon nanotubes using a soaking mode.

The so-called spraying mode refers to the process of spraying a P-doped solution to the pattern formed by carbon nanotubes, to achieve doping of the pattern formed by carbon nanotubes. By means of this mode, the doping precision of the pattern formed by carbon nanotubes can be achieved by controlling the flow, pressure and the like of the spraying equipment, whereas the doping efficiency of the spraying mode is lower than that of the soaking mode.

Figure 1:
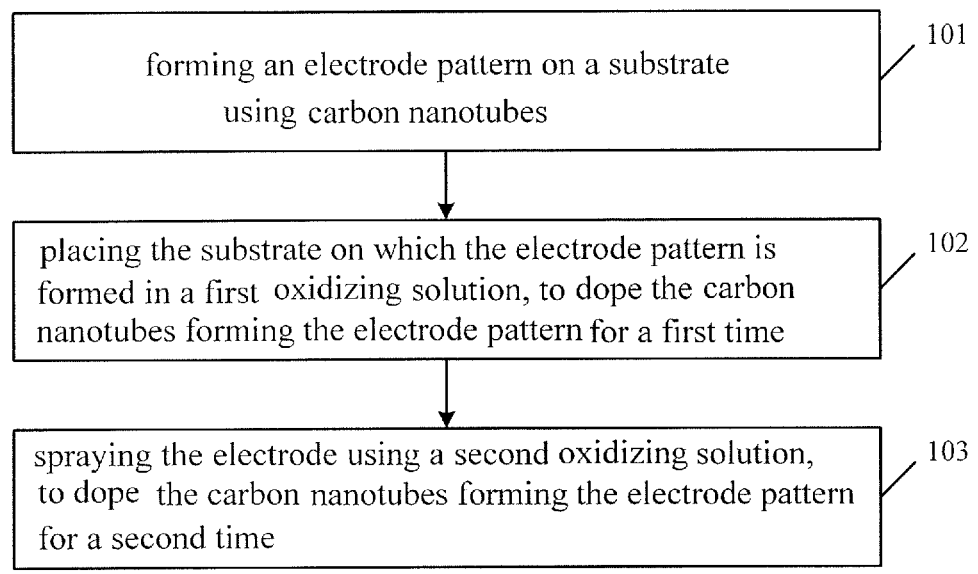
FIG. 1 is a flow diagram of the method of manufacturing an electronic device according to an embodiment of the present disclosure.

The method of manufacturing an electronic device according to the examples of the present disclosure, as shown in FIG. 1, comprises the following steps.

Step 101, forming a carbon nanotube electrode pattern on a substrate;

Step 102, placing the substrate on which the electrode pattern is formed into a first oxidizing solution, to first dope the carbon nanotubes forming the electrode pattern;

Step 103, spraying the electrode using a second oxidizing solution, to second dope the carbon nanotubes forming the electrode pattern.

In the method of manufacturing an electronic device of the specific embodiments of the present disclosure, following the manufacture of a transparent electrode, the transparent electrode is then subjected to treatments of soaking and spraying using a second oxidizing solution and the carbon nanotubes are doped, to obtain modified carbon nanotubes, thereby improving the conductivity of the electrode formed using carbon nanotubes, which will be subsequently verified by providing experimental data.

In the method of manufacturing an electronic device of the specific embodiments of the present disclosure, the carbon nanotubes forming an electrode are firstly doped efficiently by a soaking mode to reach a certain concentration and then the precise doping of the remaining concentration is achieved by a spraying mode, which takes full advantage of the characteristic of the high efficiency of the soaking mode and ensures the doping precision of the carbon nanotube film layer by a spraying mode, thereby ensuring stability and consistency of the performance of a product.

Meanwhile, as being different from the conventional doping method, the method of manufacturing an electronic device of the embodiments of the present disclosure does not involve doping the materials for manufacturing an electrode, while it involves doping the electrode formed, which can result in a carbon nanotube electrode with a higher doping precision, which is set forth below.

Typically, it takes numerous processes, such as coating, exposure, development, etching and the like, to transform carbon nanotube powders to a carbon nanotube pattern. The improved electrical performance of the P-doped carbon nanotubes is attributed to the reaction between the doped material and the carbon nanotubes as well as the structure reconstruction thereof. However, if the carbon nanotube powders originally used to manufacture a carbon nanotube layer are doped before further manufacturing a carbon nanotube pattern, then the performance of the doped carbon nanotube powders, in the course of forming a pattern, will be affected by environmental conditions and various processes, resulting in decreased stability and therefore worsening electrical performance, for example: square resistance becomes larger and local resistance undergoes significant changes, which ultimately leads to a low quality of products.

In the embodiments of the present disclosure, doping is carried out after forming a carbon nanotube transparent electrode pattern, which avoids the impact of numerous processes in the process of transforming carbon nanotube powders to a carbon nanotube pattern on the structure formed between the doped material and the carbon nanotubes and can provide a carbon nanotube electrode with higher doping precision, and as a result of which, the carbon nanotube electrode pattern manufactured becomes more stable and has better weatherability and reliability.

In the specific embodiments of the present disclosure, an electrode pattern using carbon nanotubes can be formed by a variety of modes, which are exemplified as follows.

<Mode 1: Etching after Forming a Film Directly on a Substrate>

In Mode 1, a carbon nanotube film is formed directly on a substrate and then an electrode pattern is formed using the carbon nanotube film via one etching process.

<Mode 2: Attaching after Pre-Making a Pattern>

In Mode 2, an electrode pattern may be formed pre-using carbon nanotubes by other modes followed by attaching the electrode pattern to the corresponding position of the substrate.

As for the electronic device of the specific embodiments of the present disclosure, after doping the carbon nanotubes of the electrode pattern, it is further required to subsequently manufacture other functional layers (for example, if the electronic device is a solar cell, it is further required to subsequently manufacture a photoelectric conversion module, and if the electronic device is a thin film transistor, while the electrode is a gate electrode, it is further required to subsequently manufacture a gate insulating layer, source and drain electrodes, etc., for another example, if the electronic device is a display panel, while the electrode is a pixel electrode, it is further required to subsequently manufacture a flat layer, etc.). In order to avoid the influence of the doped solution on the subsequent process, the method of manufacturing an electronic device of the specific embodiments of the present disclosure further comprises: washing the sprayed substrate.

In order to improve the washing effect, deionized water may be used for washing.

Of course, after washing, the washed substrate can also be dried to reduce the impact of the washing solution on the subsequent manufacturing process.

In the specific embodiments of the present disclosure, the carbon nanotubes are P doped by an oxidizing solution to improve its conductivity, wherein the oxidizing solution (the first solution and the second solution) is selected from a solution of at least one of the following materials: nitrogen dioxide, elemental bromine (Br), nitric acid, thionyl chloride, a perfluorosulfonic acid-PTFE copolymer (Nation), and 2,3,5,6-tetrafluoro-7,7',8,8'-tetracyano dimethyl-p-benzoquinone.

In the specific embodiments of the disclosure, in order to maintain the stability of the modified carbon nanotube film layer in the course of use, the method further comprises: forming a conductive protective pattern on the electrode pattern.

Since the conductive protective pattern formed on the electrode pattern is able to protect the electrode pattern covered, the stability of the electrical properties of the pattern formed by the carbon nanotubes in the course of use is ensured, thereby improving the performance of the product.

Ever since polyacetylene having conductivity has been discovered, the concept that organic polymers cannot serve as conductive materials has been entirely changed, and conductivity has become one of the important properties of a polymer. However, compared with metal materials, polymers exhibit better stability. As such, taking the stability of the conductive protective pattern into account, in the specific embodiments of the present disclosure, the conductive protective pattern is formed from a conductive polymer material.

Meanwhile, since the conductivity of the conductive polymer material is slightly worse than that of the modified carbon nanotubes, in order to improve conductivity while protecting the pattern formed by the carbon nanotube, in the specific embodiments of the present disclosure, the conductive protective pattern is formed by a conductive polymer material doped with nano golden balls or nano silver wires.

The above nano golden balls or nano silver wires that are doped into the conductive polymer material can significantly improve the conductivity of the protective layer.

The conductive polymer material is selected from the group consisting of polyacetylene, polythiophene, polypyrrole, polyaniline, polyphenylene, polyphenylene acetylene and poly diacetylene.

In the specific embodiments of the present disclosure, forming a conductive protective pattern on the electrode pattern specifically comprises: subjecting the conductive polymer material to a solvation treatment using a room-temperature ionic liquid; forming the conductive protective pattern using the conductive polymer material after the solvation treatment.

Room-temperature ionic liquids, also known as room-temperature molten salts, organic room-temperature ionic liquids or the like, refer to a salt composed of ions only and being liquid at room temperature or lower temperatures.

Room-temperature ionic liquids are primarily used as solvents for chemical reactions, and exhibit a lot of excellent properties: being non-volatile and capable of reducing environmental pollution arising from evaporation; their solubility to inorganic substances, water, organic substances and polymers can be adjusted through the design of anions and cations.

In the specific embodiments of the present disclosure, the conductive polymer material is dissolved by a room-temperature ionic liquid, thereby forming a conductive protective layer using a dissolved conductive polymer material such that the conductive protective pattern formed is very uniform, which improves the performance of the product.

The room-temperature ionic liquid is selected from the group consisting of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate, 1-butyl-3-methylimidazolium chloride.

The electrode pattern in the specific embodiments of the present disclosure may be an electrode of a solar cell. However, the electronic equipment of the embodiments of the present disclosure may be a display panel provided with a solar cell, the electrode pattern being an electrode of the solar cell.

The embodiments of the present disclosure also provide an electronic device obtained using the above manufacturing method.

The manufacturing method of the embodiments of the present disclosure is described in further detail below taking the manufacture of an electrode of a solar cell in a display panel as an example.

Figure 2:
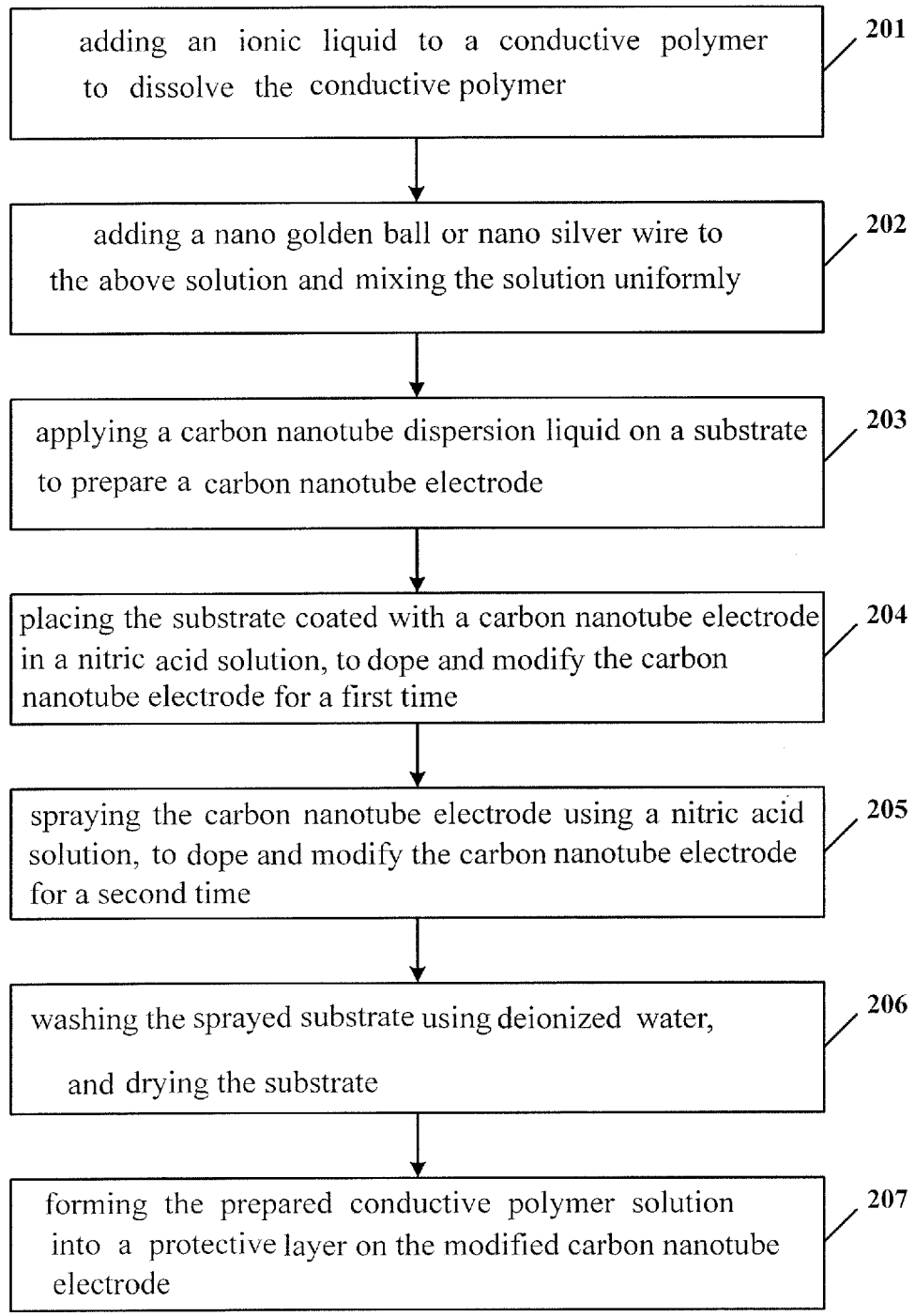
FIG. 2 is a diagram of the detailed manufacturing process of the method of manufacturing an electronic device according to an embodiment of the present disclosure.

As shown in FIG. 2, the manufacturing method of the embodiments of the present disclosure comprises the following steps:

Step 201, adding an ionic liquid to a conductive polymer to dissolve the conductive polymer.

Step 202, adding nano golden balls or nano silver wires to the above solution and mixing the solution uniformly.

Step 203, applying a carbon nanotube dispersion liquid on a substrate to prepare a carbon nanotube electrode;

Step 204, placing the substrate coated with a carbon nanotube electrode into a nitric acid solution for 5 to 30 minutes at room temperature, to first dope and modify the carbon nanotube electrode.

In specific embodiments of the present disclosure, when the soaking time is short, it may be impossible to take full advantage of the characteristic of the high doping efficiency of the soaking mode, whereas when the soaking time is long, it is unlikely to adjust the doping concentration by the spraying mode and thus it would be impossible to take full advantage of the characteristic of the high doping precision of the spraying mode. Consequently, in the specific embodiments of the present disclosure, the time of the soaking mode is between 5 minutes and 30 minutes.

Step 205, spraying the carbon nanotube electrode using a nitric acid solution, to second dope and modify the carbon nanotube electrode.

Step 206, washing the sprayed substrate using deionized water, and drying the substrate using an air knife.

Step 207, forming the prepared conductive polymer solution into a protective layer on the modified carbon nanotube electrode.

Figure 3:
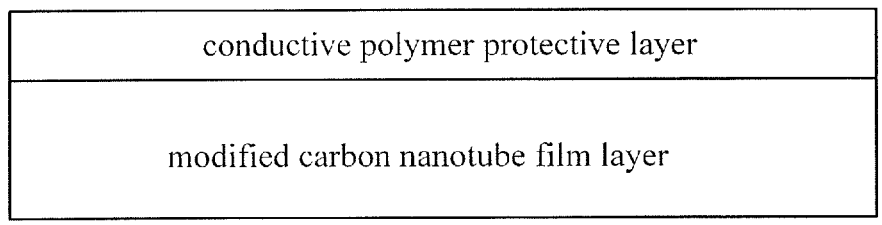
FIG. 3 is a schematic diagram of the electrode formed using the manufacturing method according to an embodiment of the present disclosure.

As shown in FIG. 3, it is a schematic diagram of the electrode formed using the manufacturing method of the embodiments of the present disclosure. As shown in FIG. 3, the electrode formed using the manufacturing method of the embodiments of the present disclosure comprises two parts: a modified carbon nanotube film layer and a conductive polymer protective layer. The conductive polymer protective layer protects the modified carbon nanotube film layer by covering it.

Figure 4:
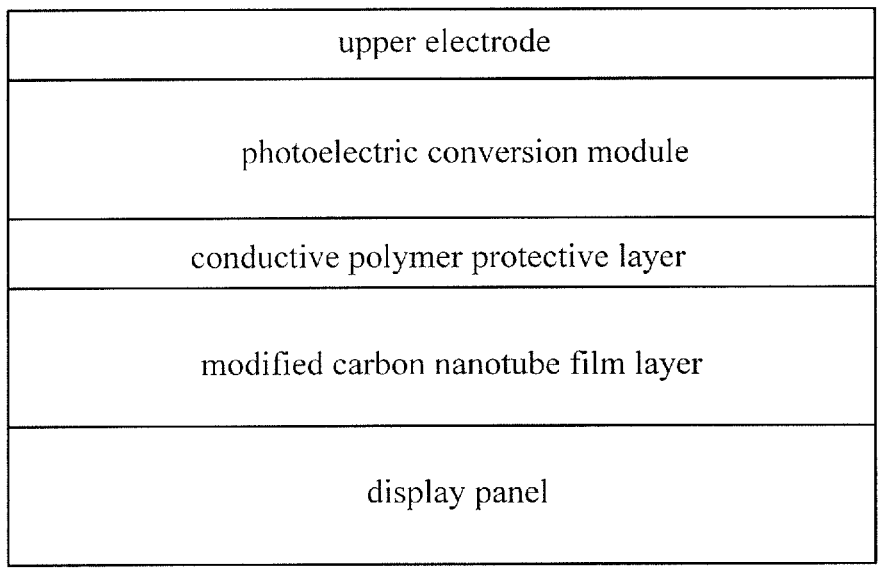
FIG. 4 is a schematic diagram of the display module comprising a solar cell in which an electrode of the solar cell is formed using the manufacturing method of an embodiment of the present disclosure.

As shown in FIG. 4, it is a schematic diagram of the display module comprising the solar cell when the electrode formed using the manufacturing method of the examples of the present disclosure is an electrode of a solar cell. As shown in FIG. 4, the display module comprises two major parts: a display part and a solar cell part. In order that the solar cell is able to sufficiently absorb external light to generate electricity, the solar cell part should be disposed over the display panel.

In addition, the solar cell part comprises: an upper electrode; a lower electrode; and a photoelectric conversion layer between the upper and lower electrodes, which is typically a PN junction arranged in pairs; the electrode includes a structure as shown in FIG. 3.

The following is a table including the experimental data of the examples of the present disclosure.

TABLE 1

| Example No. | Solute of the first solution and the second solution | Concentration wt % | Soaking time T1, minutes | Spraying time T2, minutes | Square resistance ohm |
|---|---|---|---|---|---|
| 1 | nitric acid | 3 | 30 | 10 | 111.2 |
| 2 | nitric acid | 5 | 30 | 10 | 9.8 |
| 3 | nitric acid | 10 | 20 | 7.5 | 8.0 |
| 4 | nitric acid | 15 | 18 | 2 | 6.9 |
| 5 | nitric acid | 20 | 18 | 2 | 5.8 |
| 6 | nitric acid | 35 | 18 | 2 | 5.8 |
| 7 | thionyl chloride | 3 | 30 | 10 | 111.6 |
| 8 | thionyl chloride | 10 | 30 | 10 | 10.2 |
| 9 | thionyl chloride | 15 | 20 | 5 | 9.0 |
| 10 | thionyl chloride | 20 | 15 | 2 | 8.2 |
| 11 | thionyl chloride | 25 | 15 | 2 | 7.0 |
| 12 | thionyl chloride | 35 | 15 | 2 | 7.0 |
| 13 | perfluorosulfonic acid-PTFE copolymer | 3 | 30 | 10 | 110 |
| 14 | perfluorosulfonic acid-PTFE copolymer | 15 | 30 | 10 | 11.5 |
| 15 | perfluorosulfonic acid-PTFE copolymer | 20 | 20 | 7.5 | 9.6 |
| 16 | perfluorosulfonic acid-PTFE copolymer | 30 | 10 | 5 | 8.7 |
| 17 | perfluorosulfonic acid-PTFE copolymer | 35 | 10 | 5 | 8.7 |

The square resistance of the carbon nanotube electrode prior to doping and obtained by testing is 112Ω. From the above table, it can be seen that the square resistance of the carbon nanotube electrode can be reduced as long as the above oxidizing solution is used for soaking and spraying.

In the examples of the present disclosure, the spraying time is between 2 minutes and 10 minutes.

As regards different solutes, different concentrations are taken for testing, and it can be found that in the specific embodiments of the present disclosure, in the case of the same solute, given that the soaking time and spraying time are the same, when the concentration of the solution is less than 5 wt %, the reduction in the resistance of the carbon nanotube electrode is small, for example:

In the case of using a nitric acid solution with a concentration of 3 wt % to soak for 30 minutes and spray for 10 minutes, the square resistance of the carbon nanotube electrode can be reduced from 112 ohms to 111.2 ohms;

In the case of using a thionyl chloride solution with a concentration of 3 wt % to soak for 30 minutes and spray for 10 minutes, the square resistance of the carbon nanotube electrode can be reduced from 112 ohms to 111.6 ohms;

In the case of using a perfluorosulfonic acid-PTFE copolymer solution with a concentration of 3 wt % to soak for 30 minutes and spray for 10 minutes, the square resistance of the carbon nanotube electrode can be reduced from 112 ohms to 110 ohms.

As can be seen from the data in Table 1, when the concentration of the first solution and the second solution is greater than 5 wt %, the square resistance of the carbon nanotube electrode can be reduced from 112 ohms to less than 11.5 ohms. As can be seen from Table 1, the time of the soaking step may be 5 minutes to 30 minutes, or 10 minutes to 20 minutes, or 15 minutes to 18 minutes. As can be seen from Table 1, the time of the spraying step may be 2 minutes to 10 minutes, or 5 minutes to 7.5 minutes. However, in the present disclosure, the time of the soaking step and the spraying step is not limited thereto.

Nonetheless, when the nitric acid solution with a concentration of 20 wt % or 35 wt % is used, based on the same soaking time and spraying minutes, the square resistance of the carbon nanotube electrode can be reduced to 5.8 ohms (which may vary after percentile), that is, when the concentration of the nitric acid solution exceeds 20 wt %, the optimal reduction in square resistance is obtained;

When the thionyl chloride solution with a concentration of 25 wt % or 35 wt % is used, based on the same soaking time and spraying minutes, the square resistance of the carbon nanotube electrode can be reduced to 7.0 ohms, that is, when the concentration of the thionyl chloride solution exceeds 25 wt %, the optimal reduction in square resistance is obtained;

When the perfluorinated sulfonic acid-PTFE copolymer solution with a concentration of 30 wt % or 35 wt % is used, based on the same soaking time and spraying minutes, the square resistance of the carbon nanotube electrode can be reduced to 8.7 ohms, that is, when the concentration of the perfluorinated sulfonic acid-PTFE copolymer solution exceeds 30 wt %, the optimal reduction in square resistance is obtained.

Therefore, in the specific embodiments of the present disclosure, when the first solution and the second solution are chosen from: a nitric acid solution, a thionyl chloride solution or a perfluorinated sulfonic acid-PTFE copolymer solution, the corresponding concentration ranges from 5 wt % to 20 wt % or greater, from 5 wt % to 25 wt % or greater, from 5 wt % to 30 wt % or greater.

In the method of manufacturing an electronic device set forth in specific embodiments of the present disclosure, following the manufacture of a transparent electrode, the transparent electrode is then subjected to treatments of soaking and spraying using a second oxidizing solution and the carbon nanotubes are doped, to obtain modified carbon nanotubes, thus improving the conductivity of the electrode formed using carbon nanotubes. Meanwhile, in the method of manufacturing an electronic device set forth in the specific embodiments of the present disclosure, the carbon nanotubes forming an electrode are firstly doped efficiently by means of soaking to reach a certain concentration and then the precise doping of the remaining concentration is achieved by means of spraying, which takes full advantage of the characteristic of the high efficiency of soaking and ensures the doping precision of the carbon nanotube film layer through spraying, thereby ensuring the stability and consistency of the performance of a product.

In addition, as regards the carbon nanotubes doped using P-Doping, the improvement in their electric properties is derived from the reaction between the doping material and the carbon nanotubes as well as the structure reconstruction thereof, while the electric properties of the carbon nanotubes after doping tend to be affected by environmental conditions and subsequent processes, thereby reducing their stability and therefore their electric properties, for example: square resistance becomes larger and, moreover, local resistance undergoes significant changes, which ultimately leads to a low quality of products arising from reduction in uniformity of electrical properties of the electrode structure. As a consequence, the present disclosure employs a doping process carried out after forming a carbon nanotube transparent electrode.

In order to enable the doped carbon nanotube electrode to achieve stability and excellent weatherability and reliability, the present disclosure further designs a protective layer structure on the doped electrode structure.

The embodiments of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

This application claims the priority of the Chinese Patent Application No. 201510069890.6 filed on Feb. 10, 2015, the disclosure of which is fully incorporated herein by reference as part of the present application.

What is claimed is:

1. A method of manufacturing an electronic device, comprising:
   forming a carbon nanotube electrode pattern on a substrate;
   placing the substrate on which the electrode pattern is formed into a first oxidizing solution, to dope the carbon nanotubes forming the electrode pattern for a first time;
   spraying a second oxidizing solution on the electrode pattern, to dope the carbon nanotubes forming the electrode pattern for a second time; and
   washing the substrate that is sprayed.

2. The method of manufacturing an electronic device according to claim 1, wherein deionized water is used for washing the sprayed substrate.

3. The method of manufacturing an electronic device according to claim 1, further comprising:
   drying the substrate that is washed.

4. The method of manufacturing an electronic device according to claim 1, wherein the first solution and the second solution are selected from a solution formed from at least one of the following materials: nitrogen dioxide, elemental bromine, nitric acid, thionyl chloride, perfluorosulfonic acid-PTFE copolymer and 2,3,5,6-tetrafluoro-7,7', 8,8'-tetracyano dimethyl-p-benzoquinone.

5. The method of manufacturing an electronic device according to claim 1, further comprising:
   forming a conductive protective pattern on the electrode pattern.

6. The method of manufacturing an electronic device according to claim 5, wherein the conductive protective pattern is made of a conductive polymer material.

7. The method of manufacturing an electronic device according to claim 5, wherein the conductive protective pattern is made of a conductive polymer material doped with nano golden balls or nano silver wires.

8. The method of manufacturing an electronic device according to claim 6, wherein the conductive polymer material is selected from a group consisting of polyacetylene, polythiophene, polypyrrole, polyaniline, polyphenylene, polyphenylene acetylene and poly diacetylene.

9. The method of manufacturing an electronic device according to claim 5, wherein forming a conductive protective pattern on the electrode pattern comprises:
   subjecting the conductive polymer material to a solvation treatment by using a room-temperature ionic liquid;
   forming the conductive protective pattern using the conductive polymer material after the solvation treatment.

10. The method of manufacturing an electronic device according to claim 6, wherein the room-temperature ionic liquid is selected from a group consisting of 1-ethyl-3-methylimidazolium hexafluorophosphate, 1-butyl-3-methyl-imidazolium hexafluorophosphate, 1-octyl-3-methylimida-zolium hexafluorophosphate, 1-ethyl-3-methylimidazolium tetrafluoroborate, 1-butyl-3-methylimidazolium trifluorom-ethylsulfonate , 1-butyl-3-methylimidazolium chloride.

11. The method of manufacturing an electronic device according to claim 1, wherein the electrode pattern is an electrode of a solar cell.

12. The method of manufacturing an electronic device according to claim 1, wherein the electronic device is a display panel provided with a solar cell, and the electrode pattern is an electrode of the solar cell.

13. The method of manufacturing an electronic device according to claim 1, wherein a concentration of the first solution is greater than or equal to 5 wt %, and a concentration of the second solution is greater than or equal to 5 wt %.

14. The method of manufacturing an electronic device according to claim 1, wherein the substrate on which the electron pattern is formed is placed into the first oxidizing solution for a time period of 5 to 30 minutes, to dope the carbon nanotubes forming the electrode pattern for the first time, and then, the electrode is spayed by the second oxidizing solution for a time period of 2 to 10 minutes, to dope the carbon nanotubes forming the electrode pattern for the second time.

15. The method of manufacturing an electronic device according to claim 1, wherein the first solution and the second solution are selected from a group consisting of a nitric acid solution with a concentration of 20 wt % to 35 wt %, a thionyl chloride solution with a concentration of 25 wt % to 35 wt %, and a perfluorosulfonic acid-PTFE copolymer solution with a concentration of 30 wt % to 35 wt %.

* * * * *